(12) United States Patent  
Fu et al.

(10) Patent No.: US 9,416,004 B2
(45) Date of Patent: Aug. 16, 2016

(54) SEMICONDUCTOR DEVICE AND FABRICATION METHOD

(71) Applicant: Semiconductor Manufacturing International (Shanghai) Corporation, Shanghai (CN)

(72) Inventors: Guangcai Fu, Shanghai (CN); Tianlun Yang, Shanghai (CN); Xiaoping Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/595,543

(22) Filed: Jan. 13, 2015

(65) Prior Publication Data
US 2015/0203351 A1    Jul. 23, 2015

(30) Foreign Application Priority Data
Jan. 21, 2014    (CN) .......................... 2014 1 0027719

(51) Int. Cl.
| | |
|---|---|
| *H01L 21/44* | (2006.01) |
| *B81C 1/00* | (2006.01) |
| *H01L 21/475* | (2006.01) |

(52) U.S. Cl.
CPC .......... *B81C 1/00849* (2013.01); *B81C 1/00095* (2013.01); *H01L 21/475* (2013.01); *H01L 2221/1063* (2013.01)

(58) Field of Classification Search
CPC ................... H01L 21/475; H01L 2221/1063; B81B 7/0006; B81B 2201/0264; B81B 2201/0292
See application file for complete search history.

(56) References Cited

U.S. PATENT DOCUMENTS

| | | | | |
|---|---|---|---|---|
| 2004/0085606 A1* | 5/2004 | Valette | ................. | B81B 3/0062 359/224.1 |
| 2011/0014793 A1* | 1/2011 | Muramatsu | ............ | C11D 3/042 438/706 |
| 2014/0308810 A1* | 10/2014 | Ko | ........................ | H01L 21/475 438/653 |

* cited by examiner

*Primary Examiner* — A. Sefer
(74) *Attorney, Agent, or Firm* — Anova Law Group, PLLC

(57) ABSTRACT

Semiconductor devices and fabrication methods are provided. In a semiconductor device, a semiconductor substrate includes a first electrode layer having a top surface coplanar with a top surface of the semiconductor substrate. A sacrificial layer is formed on the semiconductor substrate and the first electrode layer. A first mask layer made of a conductive material is formed on the sacrificial layer. The first mask layer and the sacrificial layer are etched until a surface of the first electrode layer is exposed to form openings through the first mask layer and the sacrificial layer. A cleaning process is performed to remove etch byproducts adhered to a surface of the first mask layer and adhered to sidewalls and bottom surfaces of the openings. Conductive plugs are formed in the openings after the cleaning process.

20 Claims, 6 Drawing Sheets

SEMICONDUCTOR DEVICE AND FABRICATION METHOD

CROSS-REFERENCES TO RELATED APPLICATIONS

This application claims the priority of Chinese Patent Application No. 201410027719.4 filed on Jan. 21, 2014, the entire content of which is incorporated herein by reference.

FIELD OF THE DISCLOSURE

The present disclosure relates to the field of semiconductor technology, more particularly, relates to semiconductor devices and fabrication methods.

BACKGROUND

A Micro-Electro Mechanical System (MEMS) is an integrated device capable of obtaining information, processing information, and performing operations. Sensors embedded in an MEMS system are able to sense outside information such as pressure, position, speed, acceleration, magnetic field, temperature, and humidity, and to convert the sensed information to electrical signals. The electrical signals can then be processed in the MEMS. A pressure sensor is a device capable of converting pressure signals to electrical signals.

A capacitive pressure sensor is one of the conventional pressure sensors. A conventional capacitive pressure sensor includes: a substrate; a first electrode layer on the substrate; and a second electrode layer on top of the substrate and the first electrode layer. A cavity is formed between the first electrode layer and the second electrode layer and isolates the first electrode layer from the second electrode layer.

The first electrode layer, the second electrode layer, and the cavity form a capacitive structure. When the second electrode layer is subjected to pressure and undergoes a deformation, the distance between the first electrode layer and the second electrode layer changes. The capacitance of the capacitive structure then changes accordingly. Since the pressure on the second electrode layer corresponds to the capacitance of the capacitive structure, the pressure on the second electrode layer can be converted to an output signal of the structure.

However, the conventional pressure sensor lacks electrical stability.

BRIEF SUMMARY OF THE DISCLOSURE

One aspect or embodiment of the present disclosure provides a semiconductor fabrication method. A semiconductor substrate is provided to include a first electrode layer therein. The first electrode layer has a top surface coplanar with a top surface of the semiconductor substrate. A sacrificial layer is formed on the semiconductor substrate and the first electrode layer. A first mask layer, made of a conductive material, is formed on the sacrificial layer. The first mask layer and the sacrificial layer are etched until a surface of the first electrode layer is exposed to form openings through the first mask layer and the sacrificial layer. A cleaning process is performed to remove etch byproducts adhered to a surface of the first mask layer and adhered to sidewalls and bottom surfaces of the openings. Conductive plugs are formed in the openings after the cleaning process.

Another aspect or embodiment of the present disclosure provides a semiconductor device. The semiconductor device includes a semiconductor substrate, and a first electrode layer disposed in the semiconductor substrate. The first electrode layer has a top surface coplanar with a top surface of the semiconductor substrate. A sacrificial layer is disposed on the semiconductor substrate and the first electrode layer. A first mask layer is disposed on the sacrificial layer. The first mask layer is made of a conductive material. Conductive plugs are formed through the first mask layer, through the sacrificial layer, and on a surface of the first electrode layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

Figure 1:
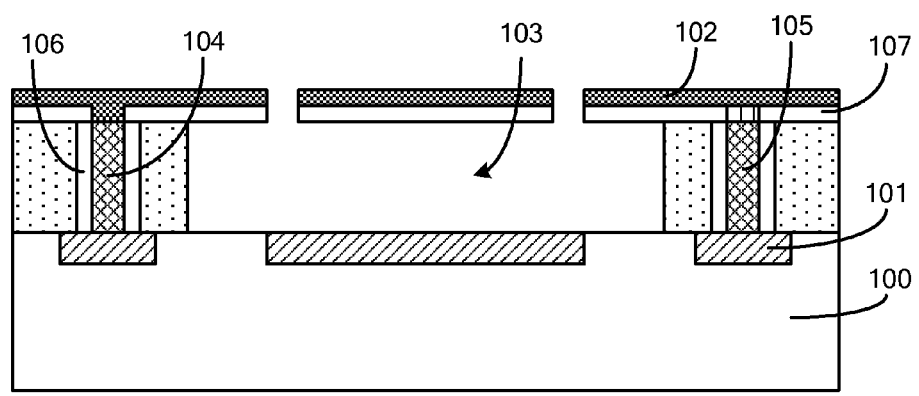
FIG. 1 is a cross-section illustration of a conventional pressure sensor.

Pressure sensors may lack electrical stability. FIG. 1 is a cross-section view of a conventional pressure sensor. The conventional pressure sensor includes: a substrate 100, a first electrode layer 101 on the substrate; and a second electrode layer 102 on the substrate 100 and the first electrode layer 101. A cavity 103 is formed between the first electrode layer 101 and the second electrode layer 102. A first conductive plug 104 and a second conductive plug 105 are formed between the first electrode layer 101 and the second electrode layer 102. The second conductive plug 105 and the second electrode layer 102 are electrically isolated by an isolation layer. The first electrode layer 101 under the second conductive plug 105 and the first conductive plug 104 are electrically isolated. The sidewalls of the first conductive plug 104 and the second conductive plug 105 are surrounded by a protective layer 106, respectively. A second protective layer 107 is located between the opposing layers of the second electrode layer 102 and the first electrode layer 101.

The first conductive plug 104 and the second conductive plug 105 are configured to provide support for the second electrode layer 102 overhanging above the first electrode layer 101. Further, voltages are applied on the first electrode layer 101 and the second electrode layer 102 to sense the capacitance variation of the capacitive structure formed by the first electrode layer 101, the second electrode layer 102, and the cavity 103. In addition, the first conductive plug 104 and the second conductive plug 105 are connected to the first electrode layer 101, respectively. The first electrode layer 101 is connected to the first conductive plug 104 and electrically isolated from the first electrode layer 101 connected to the second conductive plug 105 by a humidity-sensitive dielectric material. The electrically isolated first electrode layer 101 and humidity-sensitive dielectric material form a humidity-sensitive capacitive sensor. By applying voltages on the first conductive plug 104 and the second conductive plug 105, the capacitance variation of the humidity-sensitive capacitance sensor formed by the first electrode 101 and the humidity-sensitive material can be obtained. Therefore, the humidity-sensitive capacitance sensor can sense pressure and humidity of the outside environment.

When fabricating the sensor shown in FIG. 1, a sacrificial layer is formed in the cavity 103. The second protective layer and the second electrode layer 102 are formed on the sacrificial layer. Later, the sacrificial layer is removed after the formation of the second electrode layer 102. Since the first conductive plug 104 and the second conductive plug 105 are formed in the sacrificial layer, the sacrificial layer needs to be etched to form openings that are used to form the first conductive plug 104 and the second conductive plug 105.

When forming openings in the sacrificial layer, a dielectric material, such as a silicon oxide, is often used as an etch mask. Due to the sufficiently low mechanical strength of the dielectric material and a desirable deep opening, the dielectric layer used as the etch mask is usually thick in order to ensure the mask pattern to stay stable during an etch process. However, it has been found that, etch byproducts, e.g., polymers, are prone to be formed from etching of the dielectric mask layer. The etch byproducts are adhered to the sidewalls of the mask layer, and brought into the openings by the etchant gases when etching the sacrificial layer. The etch byproducts then get adhered to the sidewalls and the bottoms of the openings. These etch byproducts can provide the subsequently formed first conductive plug 104 and the second conductive plug 105 with unstable electrical properties. The contact resistance between the first conductive plug 104 (and the second conductive plug 105) and the first electrode layer 101 increases accordingly. Therefore, the sensors fabricated by this method may have degraded performance and decreased stability.

When the mask layer is made of silicon dioxide and the sacrificial layer has a thickness greater than 5000 Å (e.g., the depth of the openings are greater than 5000 Å), a large amount of polymers can be formed on the sidewalls and bottoms of the openings. The polymers are normally removed by using regular wet cleaning process or dry cleaning process. However, for a sensor shown in FIG. 1, the thickness of the sacrificial layer needs to be greater than 22000 Å (e.g., the depth of the openings are greater than 22000 Å), which means a thicker layer of mask layer is needed for the etch process. Since the amount of polymers formed from the etch process increases with the thickness of the mask layer, the byproducts adhered to the sidewalls and bottoms of the openings are harder to remove.

Various embodiments provide a semiconductor device and fabrication method. For example, a first mask layer formed on the sacrificial layer is made of a conductive material. The first mask layer is also used as the etch mask for the sacrificial layer. Since etching the conductive material does not generate any hard-to-remove etch byproducts adhered to the etched surface, the sidewalls and bottoms of the openings in the sacrificial layer can be by cleaning processes after etching the first mask layer. Better electrical stability of the conductive plugs can therefore be ensured accordingly.

Further, since the first mask layer is made of a conductive layer, the first mask layer can be part of the semiconductor device after the device fabrication and does not need to be removed after the formation of the openings and the conductive plugs. Specifically, the first mask layer can be a second electrode layer. After the removal of the sacrificial layer, the first mask layer can be overhung above the first electrode layer. A pressure sensor can be formed by the first mask layer and the first electrode layer. Therefore, the fabrication process of the semiconductor device can be simplified, and damages to the conductive plugs can be reduced. The semiconductor device fabricated by this method can have desirable electrical stability.

Figure 8:
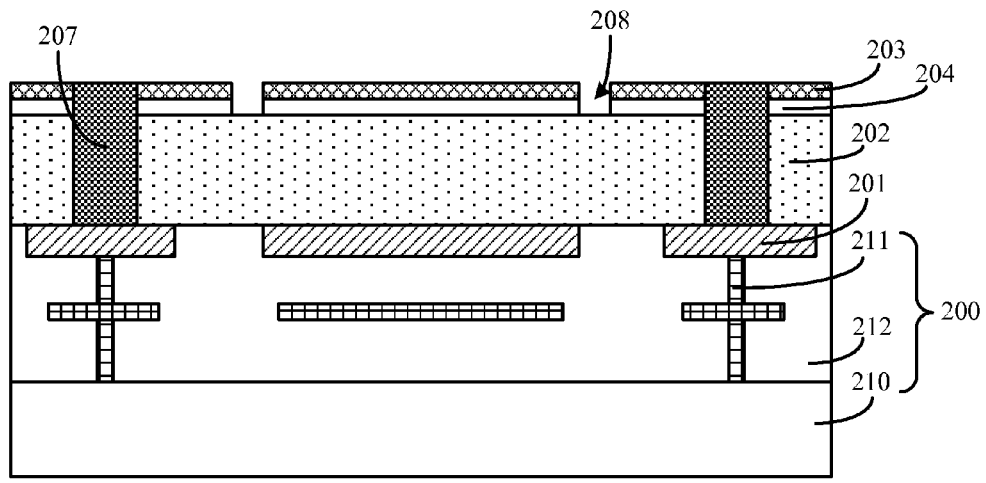
Figure 9:
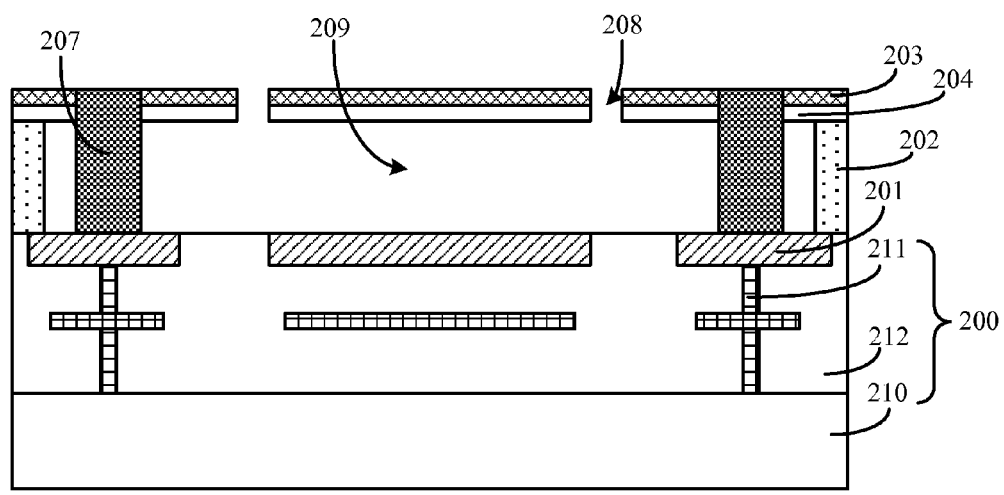
Figure 10:
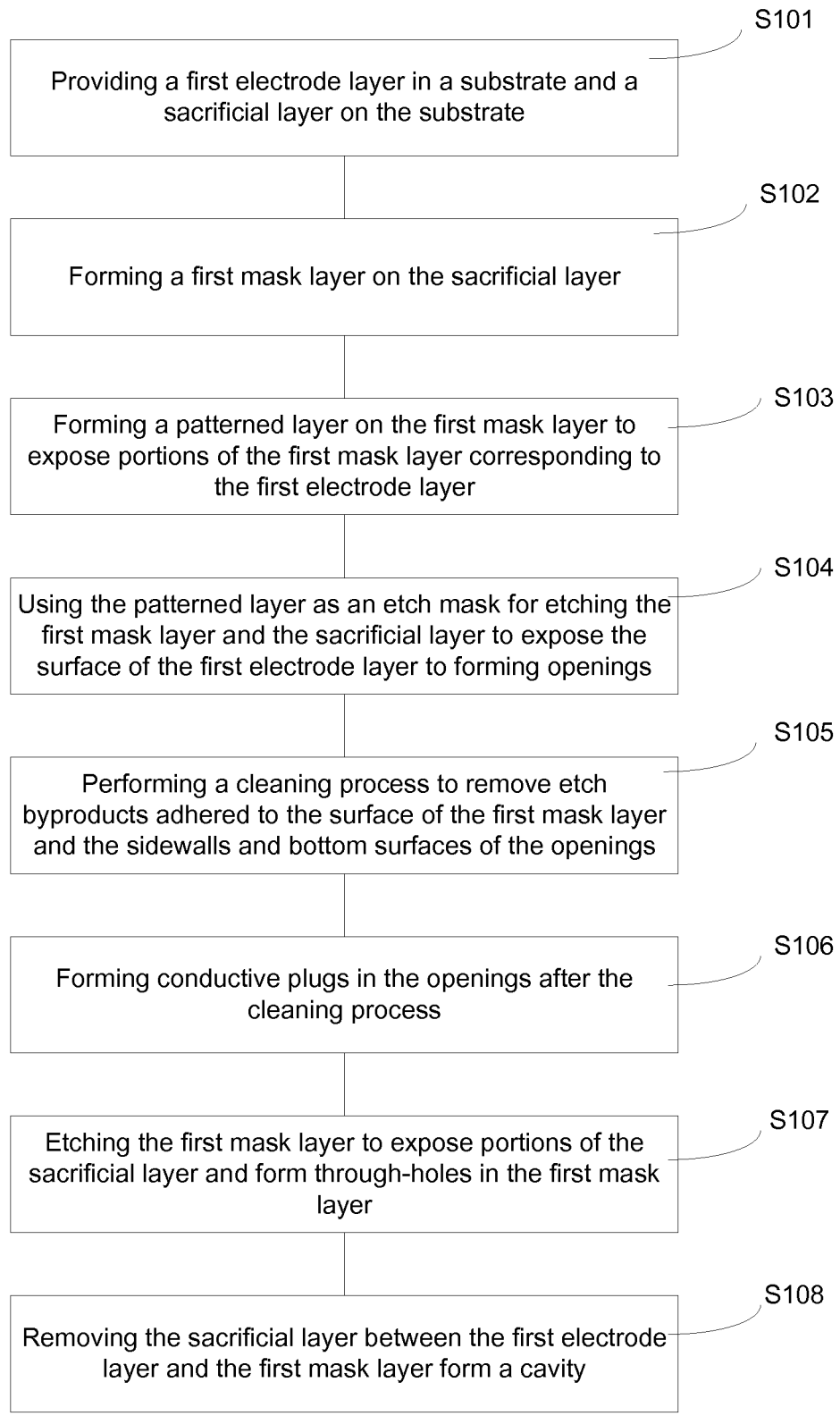
FIG. 10 illustrates an exemplary fabrication process of a semiconductor device consistent with the disclosed embodiments.

FIG. 10 illustrates an exemplary fabrication process of a semiconductor device; and FIGS. 2-9 are cross-section views of a semiconductor device corresponding to various stages during the exemplary fabrication process.

Figure 2:
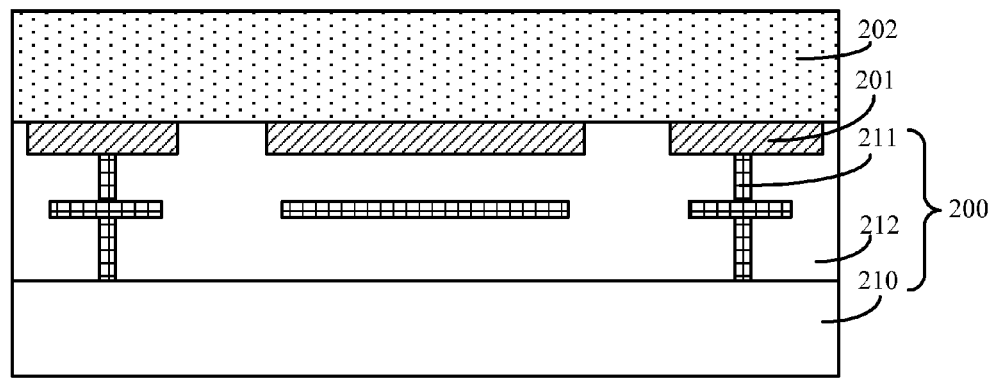
FIGS. 2-9 illustrate cross-section views of a semiconductor device corresponding to certain stages of an exemplary fabrication process consistent with the disclosed embodiments.

As shown in FIG. 10, at the beginning of the process, a substrate having a first electrode layer on top and a sacrificial layer on the first electrode layer is provided (S101). FIG. 2 illustrates a corresponding cross-section view of the semiconductor structure.

As shown in FIG. 2, a substrate 200 is provided. The substrate 200 is configured to include a first electrode layer 201. Top surfaces of the first electrode layer 201 and the substrate 200 are coplanar with each other. A sacrificial layer 202 is formed on the substrate 200 including the first electrode layer 201.

The substrate 200 may include: a semiconductor substrate 210, semiconductor components (not shown) on the semiconductor substrate 210 or in the semiconductor substrate 210, and electrical interconnect structures 211. Further, the substrate 200 may also include an isolation layer 212 configured to provide electrical isolation between the semiconductor components and the electrical interconnect structures 211.

The electrical interconnect structures 211 are configured to provide electrical connections for the corresponding semiconductor components.

In one embodiment, the first electrode layer 201 and the isolation layer 212 can form a humidity sensor. Further, the first electrode layer 201, a subsequently formed second electrode layer, and a cavity formed between the first electrode layer 201 and the second electrode layer can form a pressure sensor. Thus, the semiconductor device can be an integrated device including a pressure sensor and a humidity sensor.

The semiconductor components can be any suitable CMOS devices. The CMOS devices can further include transistors, memories, capacitors, and/or resistors.

The semiconductor substrate 210 can be made of silicon, SiGe, SiC, silicon-on-insulator (SOI), germanium-on-insulator (GOI), glass, and/or Group III-V compounds (such as GaN or GaAs).

In one embodiment, the material of the isolation layer 212 can include humidity-sensitive dielectric materials, such as polyimide. The isolation layer 212 can also be used as the dielectric layer of the capacitive humidity sensor.

In one embodiment, the substrate 200 can be a silicon substrate. The semiconductor components in the substrate 200 can be transistors (not shown). The top surface of the substrate 200 can include the top surface of the isolation layer 212. The first electrode layer 201 can be formed in the substrate 200; and the top surface of the first electrode layer 201 can be coplanar with the top surface of the isolation layer 212.

In addition, the first electrode layer 201 can be a bottom electrode of the subsequently formed pressure sensor. The subsequently formed second electrode layer can be a top electrode of the pressure sensor. The cavity subsequently formed between the first electrode layer 201 and the second electrode layer, the first electrode layer 201, and the second electrode layer can form the capacitive pressure sensor. By sensing the capacitance variation of the capacitive pressure sensor, pressure of the outside environment can be obtained.

The first electrode layer 201 can be made of conductive materials such as Cu, W, and/or Al. In one embodiment, a portion of the isolation layer 212 surrounding the first electrode layer 201 can be a humidity-sensitive material. The first electrode layer 201 can be electrically connected to the semiconductor components (not shown) via the electrical interconnect structures 211.

Since a cavity can be formed between the subsequently formed second electrode layer and the first electrode layer 201, a pressure sensor can be formed by the first electrode layer 201, the second electrode layer, and the cavity. Thus, before the formation of the second electrode layer, the sacrificial layer 202 can be formed on the first electrode layer 201. The sacrificial layer 202 can be configured to occupy the space corresponding to the subsequently formed cavity. Later, after the formation of the second electrode, the sacrificial layer 202 can be removed to form the cavity.

Since the thickness of the sacrificial layer 202 can determine the subsequently formed distance between the first electrode layer 201 and the second electrode layer, and the distance can further determine the capacitance of the capacitive structure formed subsequently between the first electrode layer 201 and the second electrode layer. The sacrificial layer 202 can be sufficiently thick to satisfy technical requirements for the capacitive structure. Specifically, the sacrificial layer 202 can be 22000 Å in one embodiment.

The sacrificial layer 202 can be formed by using a chemical vapor deposition process or a physical vapor deposition process. The material of the sacrificial layer 202 can differ from the materials of the first electrode layer 201, the subsequently formed first mask layer, and the subsequently formed second mask layer, in order to ensure less damages to the first electrode layer 201, the first mask layer, and the second mask layer during the removal process of the sacrificial layer 202.

In one embodiment, the sacrificial layer 202 can be made of amorphous carbon. The etchant gases used to etch the amorphous carbon can include oxygen, and the chemical reaction between the oxygen and the amorphous carbon can produce CO and/or $CO_2$. Therefore, solid byproducts can be reduced during the removal process of the amorphous carbon, and desirable surface morphology of the first electrode layer 201 can be provided after the etching of the sacrificial layer 202.

Figure 3:
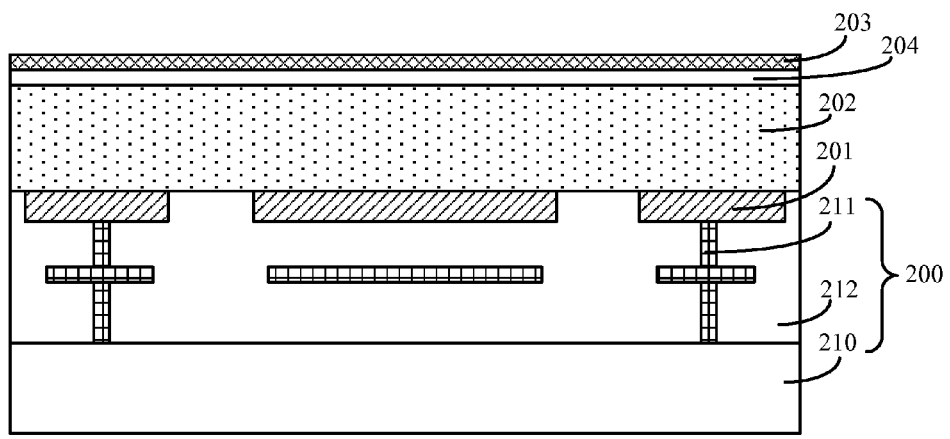

Returning to FIG. 10, a first mask layer on the sacrificial layer can be formed (S102). FIG. 3 illustrates a corresponding cross-section view of the semiconductor structure.

As shown in FIG. 3, a first mask layer 203 is formed over the sacrificial layer 202. The first mask layer 203 can be made of a conductive material.

In order to form conductive plugs on the surface of the first electrode layer 201, openings are to be made in the sacrificial layer 202 to expose portions of the first electrode layer 201. Thus, the first mask layer 203 can be formed on the sacrificial layer 202 to expose portions of the first electrode layer corresponding to the positions of the openings.

Since the openings are configured to later expose the first electrode layer 201, the depths of the openings can be equal to the thickness of the sacrificial layer 202. That is, the thickness to be removed by a subsequent etching process can be equal to the thickness of the sacrificial layer 202. Because the thickness of the sacrificial layer 202 can be sufficiently thick, the first mask layer 203 is required to have high mechanical strength to ensure the patterns of the first mask layer 203 stay stable during the etching process of the sacrificial layer 202.

Conventionally, the mask layer used to define the position and structure of the subsequently-formed openings can be made of dielectric materials with limited mechanical strength. Since the sacrificial layer can be sufficiently thick, the mask layer may also need to have a large thickness to protect the pattern of the mask layer from being damaged by over-thinning of the mask layer due to use of conventional dielectric materials for the mask layer. However, because large amount of byproducts (such as less-volatile polymers) can be generated when etching the mask layer made of conventional dielectric materials, the byproducts may gradually get adhered to the sidewalls and bottoms of the openings during the etching process. Additionally, the amount of byproducts increases as the thickness of the mask layer increases. Consequently, when conductive plugs are formed in the openings, the byproducts can cause large contact resistance between the conductive plugs and the first electrode layer.

In one embodiment, to suppress the formation of the byproduct from etching of the first mask layer 203, the first mask layer 203 can be made of a conductive material. The etching of the conductive material can produce only a small amount of byproducts, and the byproducts can be easily removed to provide clean sidewalls and the bottoms of the subsequently formed openings. Contact resistance between the conductive plugs and the first electrode layer can be reduced accordingly.

In one embodiment, the first mask layer 203 can be made of Ti, TiN, TaN, and/or Al. Since the material of the first mask layer 203 is a conductive material, the first mask layer 203 can further be used as a second electrode layer of the pressure sensor. That is, when the openings are formed in the sacrificial layer 202, the first mask layer is not removed but used as the second electrode layer on the sacrificial layer. Thus, the fabrication process can be simplified.

In addition, damages to the surface of the sacrificial layer 202 and the sidewalls and bottoms of the openings in the sacrificial layer 202 caused by the removal of the first mask layer 203 can be avoided. In one embodiment, the first mask layer 203 can be made of Ti. Ti has high mechanical strength and low resistivity and can be used as the second electrode layer of the pressure sensor.

Further, the thickness of the first mask layer 203 can be about 200 Å to about 300 Å. Since the first mask layer 203 is made of a conductive material, the first mask layer 203 thus has high mechanical strength. That is, even if the first mask layer 203 is thin, the patterns and the thickness of the first mask layer 203 can stay stable when used as the etch mask for forming the openings. Also, when the first mask layer 203 is thin, the amount of byproducts formed from etching the first mask layer 203 can be low. Thus, the low amount of byproducts further ensures clean sidewalls and bottoms of the formed openings.

In one embodiment, to prevent the first mask layer 203 from peeling off during the etching of the openings, a second mask layer 204 can be formed on the sacrificial layer 202 before forming the first mask layer 203. The first mask layer 203 can be formed on the second mask layer 204. The second mask layer 204 can improve the adhesion between the first mask layer 203 and the sacrificial layer 202.

The second mask layer 204 can be made of a dielectric layer. The thickness of the second mask layer can be about 150 Å to about 250 Å. Since the second mask layer 204 can be used to bind the first mask layer 203 with the sacrificial layer 202, the second mask layer 204 may be thin. Accordingly, the etching of the second mask layer 204 can only produce a small amount of byproducts and thus may not affect the performance of the semiconductor device.

In one embodiment, the second mask layer 204 can be made of $Si_3N_4$. The $Si_3N_4$ can improve the adhesion between the first mask layer 203 and the sacrificial layer 202. Even if the $Si_3N_4$ layer is thin, the $Si_3N_4$ layer can still provide sufficient mechanical strength as an etch mask for the subsequent etching of the sacrificial layer 202.

Additionally, the first mask layer 203 can be used as the second electrode layer of the pressure sensor, and can be kept after removing the sacrificial layer to form a cavity. The second mask layer 204 formed between the first mask layer 203 and the sacrificial layer 202 can prevent damage on the surface of the first mask layer 203 opposing the first electrode layer 201 during the removal process of the sacrificial layer 202. Thus, the surface of the second electrode layer can be protected and electrical stability of the second electrode layer can be ensured.

Figure 4:
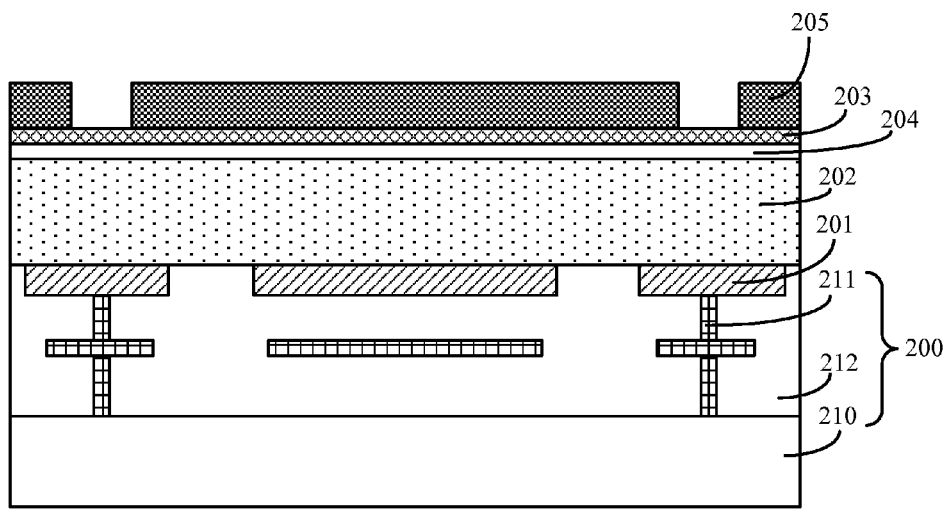

Returning to FIG. 10, after forming the first mask layer 203 on the sacrificial layer 202, a patterned layer is formed on the first mask layer to expose portions of the first mask layer corresponding to the first electrode layer (S103). FIG. 4 illustrates a corresponding cross-section view of the semiconductor structure.

As shown in FIG. 4, a patterned layer 205 is formed on the first mask layer 203 to expose portions of the first mask layer 203 corresponding to the first electrode layer 201.

The patterned layer 205 can be used as an etch mask for the subsequent etching of the first mask layer 203 and the second mask layer 204. The patterned layer 205 can also define the positions and structures of the subsequently formed openings. Specifically, the patterned layer 205 can expose portions of the first mask layer 203 corresponding to at least two separate sub-electrodes of the first electrode layer 201. That is, the multiple openings subsequently formed in the sacrificial layer 202 can expose at least two separate sub-electrodes of the first electrode layer 201.

In one embodiment, the patterned layer 205 can be made of photoresist. The fabrication process of the patterned layer 205 may include: depositing a photoresist layer on the first mask layer 203, exposing and patterning the photoresist layer, and developing the patterned photoresist layer to expose portions of the first mask layer 203 to form the patterned layer 205.

In other various embodiments, the patterned layer 205 can be formed by using multiple patterning technology (such as self-aligned double patterning technology, self-aligned triple patterning process, or double exposure process), molecular self-assembly process, or nano-printing process, in order to reduce the dimension of the openings or to reduce distance between adjacent openings in a direction parallel to the top surface of the substrate 200. As such, the patterned layer 205 can be formed to allow formation of smaller semiconductor devices.

Figure 5:
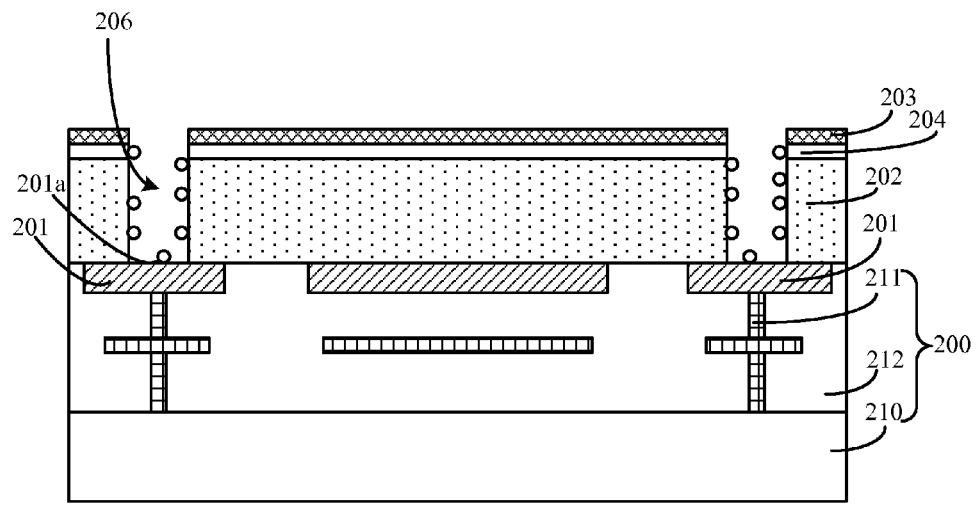

Returning to FIG. 10, after forming the patterned layer 205 on the first mask layer to expose portions of the first mask layer 203 corresponding to the first electrode layer 201, the patterned layer 205 is used as the etch mask for etching the first mask layer and the sacrificial layer to expose the surface of the first electrode layer. Further, openings are formed in the first mask layer and the sacrificial layer (S104). FIG. 5 illustrates a corresponding cross-section view of the semiconductor structure.

As shown in FIG. 5, the patterned layer 205 (as shown in FIG. 4) can be used as the etch mask for the etching of the first mask layer 203 and the sacrificial layer 202 until the surface of the first electrode layer 201 is exposed to provide a sub-electrode 201a. For example, openings 206 can be formed in the first mask layer 203 and the sacrificial layer 202 and on surface of separate sub-electrodes 201a of the first electrode layer 201.

The number of openings 206 formed in the first mask layer 203 and the sacrificial layer 206 can be at least two to expose the surfaces of at least two separate sub-electrodes 201a of the first electrode layer 201. Conductive plugs can be formed in the openings 206. The conductive plugs can be used to apply voltages on the two separate sub-electrodes of the first electrode layer 201. By sensing the capacitance variation between the two sub-electrodes 201a of the first electrode layer 201, humidity information of the outside environment can be obtained. That is, the two separate sub-electrodes 201a of the first electrode layer 201 exposed at the bottoms of the openings 206 can be the two electrode layers of the humidity sensor. In one embodiment, the number of the openings 206 can be at least two, and the bottoms of the two openings 206 can expose at least two separate sub-electrodes 201a of the first electrode layer 201.

The fabrication process of the openings 206 can include: a first etching process using the patterned layer 205 as the etch mask for the etching of the first mask layer 203 until the surface of the sacrificial layer 202 is exposed. After the first etching process, a second etching process can use the first mask layer 203 as the etch mask for the etching of the sacrificial layer 202 until the surface of the first electrode layer 201 is exposed.

For the first etching process, anisotropic dry etch can be used to etch the first mask layer 203 and the second mask layer 204 to form patterns. In one embodiment, the first mask layer 203 can be made of Ti, and the second mask layer 204 can be made of $Si_3N_4$. The parameters of the first etching process may include: a pressure of about 5 mTorr to about 15 mTorr; a power of about 400 W to 600 about W; and etchant gases including $Cl_2$, $O_2$, and HBr having a flow rate of $Cl_2$ of about 100 sccm to about 150 sccm, a flow rate of $O_2$ of about 1 to about 5 sccm, and a flow rate of HBr of about 100 sccm to about 150 sccm.

Since the first mask layer 203 can be made of a conductive layer, for example, Ti. In one embodiment, the amount of the etch byproducts produced from etching the first mask layer 203 can be sufficiently small. Also, since the first mask layer 203 can be sufficiently thin, the etching depth of the first mask layer 203 can be sufficiently shallow. Accordingly, the amount of etch byproducts produced can be sufficiently low.

In addition, the second mask layer 204 can be made of $Si_3N_4$, and the thickness can be about 150 Å to about 250 Å. Since the second mask layer 204 can only be the adhesion layer between the first mask layer 203 and the sacrificial layer 202, the second mask layer 204 can be thin. The amount of etch byproducts produced from etching the second mask 204 can be low. Also, the amount of byproducts produced can be lower than the amount of etch byproducts produced from etching $SiO_2$ or other alternative dielectric materials as conventionally used.

For the second etching process, isotropic dry etch can be used to etch the sacrificial layer 202 to form the openings 206. The first mask layer 203 and the second mask layer 204 can be used as the etch mask. In one embodiment, the sacrificial layer 202 can be made of amorphous carbon, with a thickness of about 22000 Å. The parameters of the second etching process may include: a pressure of about 80 mTorr to about 120 mTorr; a power of about 200 W to about 400 W; and etchant gases of Ar and $O_2$, having a flow rate of Ar of about 30 sccm to about 80 sccm, and a flow rate of $O_2$ of about 200 sccm to about 300 sccm. $O_2$ can be used to react with the amorphous carbon for etching. Ar can be used as a carrier gas to transport and disperse $O_2$.

In one embodiment, after the first etching process, the surface of the patterned layer 205 may be damaged and patterns may be distorted. To ensure the shapes and precise dimensions of the openings 206, the patterned layer 205 can be removed after the first etching process while before the second etching process. Thus, patterns of the patterned layer 205 would not result any adverse impact on the second etching process. That is, only the first mask layer 203 and the second mask layer 204 can be used as the etch masks for the second etching process.

Since the sacrificial layer 205 can be made of amorphous carbon, the CO or $CO_2$ produced from the reaction between the amorphous carbon and $O_2$ can be released. Thus, the amount of byproducts produced from etching the sacrificial layer 202 is considerably small. Meanwhile, since the first mask layer 203 and the second mask layer 204 can be sufficiently thin, the etching of the first mask layer 203 and the second mask layer 204 can only produce a small amount of etch byproducts. In addition, the etching of the conductive first mask layer 203 may also produce a small amount of etch products. Therefore, in the second etching process, the etch byproducts brought into the openings 206 and further adhered to the sidewalls and bottoms of the openings 206 can be small. Even if some etch byproducts are still attached in the openings 206, cleaning of the byproducts can be considerably easy.

Figure 6:
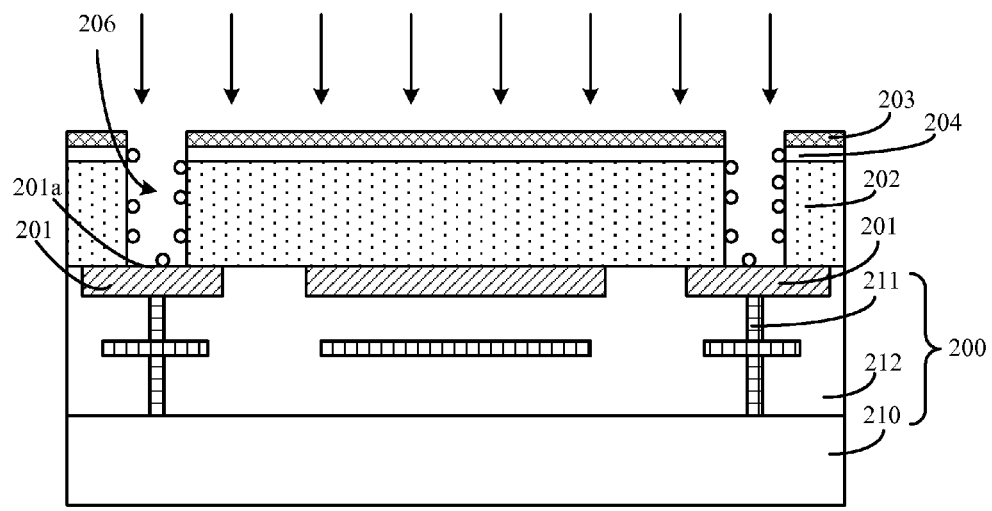

Returning to FIG. 10, after using the patterned layer 205 as the mask for etching the first mask layer 203 and the sacrificial layer 202 and forming the openings 206, a cleaning process is performed to remove the etch byproducts adhered to the surface of the first mask layer and the sidewalls and bottoms of the openings (S105). FIG. 6 illustrates a corresponding cross-section view of the semiconductor structure.

As shown in FIG. 6, a cleaning process can be performed to remove the etch byproducts adhered to the surface of the first mask layer 203 and the sidewalls and bottoms of the openings 206.

After the first etching process and the second etching process, since the amount of etch byproducts adhered to the sidewalls and bottoms of the openings 206 can be small, the etch byproducts are easily removed by cleaning. Thus, the contact resistance between the first electrode layer and the subsequently formed conductive plugs can be sufficiently small. Stable electrical properties of the semiconductor device can be ensured accordingly.

The cleaning process may include: performing a dry cleaning process on the surface of the first mask layer 203, and the sidewalls and bottoms of openings 206. Further, after the dry cleaning process, a wet cleaning process can be performed on the surface of the first mask layer 203, and the sidewalls and bottoms of openings 206.

The parameter of the dry cleaning process may include: a pressure of about 90 mTorr to about 100 mTorr; a power of about 200 W to about 400 W; and etchant gases of Ar and $O_2$ having a flow rate of Ar of about 250 sccm to about 350 sccm, and a flow rate of $O_2$ of about 10 sccm to about 30 sccm.

Since the etchant gases used for the dry cleaning process can be the same as the second etching process, the transition between the second etching process and the dry cleaning process can be easy. In addition, it is not necessary to transport the substrate 200 along with the formed semiconductor device from the etching chamber to the cleaning apparatus. Thus, contamination caused by transportation can be avoided. Further, since the amount of etch byproducts adhered to the sidewalls and bottoms of the openings 206 can be small, the etch byproducts can be cleaned by the dry etching process easily.

Additionally, the parameters of the wet cleaning process may include: a cleaning agent of ST-44, including diglycolamine (2-(2-Aminoethoxy) Ethanol) and butyrolactone (Butyrolactone); a cleaning temperature of about 50 to about 100 degrees Celsius for a cleaning time of about 50 to about 80 minutes. The wet cleaning process can be further used to remove an oxidation layer formed in previous fabrication processes. For example, oxidation layers may be formed on the first mask layer 203 and the first electrode layer 201 in the previous first etching process, the second etching process, and the dry cleaning process. Thus, small contact resistance between the first electrode layer 201 and the subsequently formed conductive plugs can be further ensured.

Figure 7:
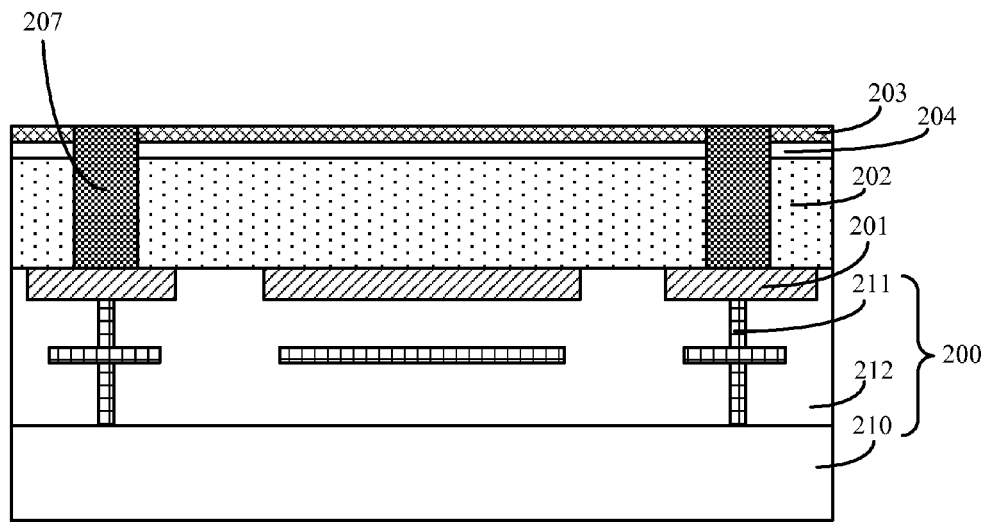

Returning to FIG. 10, after performing the cleaning process to remove the etch byproducts adhered to the surfaces of the first mask layer 203 and sidewalls and bottoms of the openings 206, conductive plugs are formed in the openings (S106). FIG. 7 illustrates a corresponding cross-section view of the semiconductor structure.

As shown in FIG. 7, after the cleaning process, conductive plugs 207 are formed in the openings 206 (shown in FIG. 6).

The conductive plugs 207 can be made of Cu, W, and/or Al. The conductive plugs 207 can be formed by using deposition, electroplating, and/or chemical plating. In one embodiment, the conductive plugs 207 can be made of W. The fabrication process of conductive plugs 207 can include forming a conductive film on the surface of the first mask layer 203, and the sidewalls and bottoms of the openings 206 to fill up the openings 206. The conductive film is then planarized by using a chemical mechanical polishing process until the surface of the first mask layer 203 is exposed. Further, the conductive plugs 207 are formed from the conductive film in the openings 206. The formation process of the conductive film can be a physical deposition process or a chemical deposition process. In other various embodiments, if the conductive plugs 207 are made of Cu, the conductive film can also be formed by using copper electrochemical plating (ECP).

In one embodiment, in order to protect the surfaces of the conductive plugs 207 during the subsequent removal process of the sacrificial layer 202, a protective layer can be formed between the conductive plugs 207 and the sacrificial layer 202. In one embodiment, the protective layer can be made of TiN or TaN. Before the formation of the conductive layer, the protective layer can be formed on the first mask layer 203, and the sidewalls and bottoms of the openings 206. After planarizing the conductive film, the chemical mechanical polishing process can be used to planarize the protective layer until the surface of the first mask layer 203 is exposed. Thus, the protective layer can be formed.

Returning to FIG. 10, after forming the conductive plugs 207 in the openings after the cleaning process, an etch process can be performed on the first mask layer to expose a portion of the sacrificial layer and form through-holes in the first mask layer (S107). FIG. 8 illustrates a corresponding cross-section view of the semiconductor structure.

As shown in FIG. 8, after the formation of the conductive plugs 207, an etch process can be performed on the first mask layer 203 until the sacrificial layer 202 is exposed. Through-holes 208 can be formed in the first mask layer 203.

After the formation of the conductive plugs 207, the sacrificial layer 202 can be removed, and a cavity can be formed between the first mask layer 203 and the first electrode layer 201, accordingly. In order to expose the sacrificial layer 202, portions of the surface of the sacrificial layer 202 may need to be exposed and a subsequent isotropic etch can be used to remove the exposed sacrificial layer 202. The cavity can thus be formed.

Since the bottoms of the through-holes 208 can expose portions of the sacrificial layer 202, the cavity between the first mask layer 203 and the first electrode layer 201 can be formed by etching the portions of the sacrificial layer 202 exposed by the bottoms of the through-holes 208. The through-holes 208 can be one or more. The through-holes can have a cross-section, in a direction parallel to the top surface of the substrate 200. The cross-section can be circular, rectangular, and/or stripe-shaped, according to specific fabrication requirements.

To form the through-holes 208, a patterned photoresist layer can be formed on the first mask layer 203 to expose portions of the first mask 203, and the exposed portions of the first mask 203 can correspond to positions of the through-holes 208. The photoresist layer can then be used as an etch mask to etch the first mask layer 203 and the second mask layer 204, until the sacrificial layer 202 is exposed. The through-holes can thus be formed. Further, the photoresist layer can be removed after the etch process. The parameters for the etching process of the first mask layer 203 and the second mask layer 204 can be the same as the parameters for the first etching process.

Returning to FIG. 10, after etching the first mask layer 203 to expose portions of the sacrificial layer 202 and form through-holes 208, the sacrificial layer 202 can be removed by using an isotropic etch to form a cavity between the first electrode layer and the first mask layer (S108). FIG. 9 illustrates a corresponding cross-section view of the semiconductor structure.

As shown in FIG. 9, an isotropic etching process can be performed on the sacrificial layer 202 exposed by the bottoms of the openings 208, and portions of the sacrificial layer 202 between the first mask layer 203 and the first electrode layer 201 can be further removed. The cavity 209 can thus be formed between the first mask layer 203 and the first electrode layer 201. The first mask layer 203 can be overhung above the first electrode layer 201.

After removing the sacrificial layer 202, the cavity 209 can be exposed to the outside such that the isolation layer 212 can also be exposed to the outside. The isolation layer 212 can be made of humidity-sensitive dielectric layer, such that the dielectric constant of the isolation layer 212 can vary with humidity. The capacitance variation between the two separate sub-electrodes of the first electrode layer 201 can be sensed, and the humidity information of the environment can thus be obtained.

The sacrificial layer 202 can be etched by an isotropic etching process. Since the etch rate of the isotropic etching process is the same in all directions, the surface of the sacrificial layer 202 can be exposed by etching in a direction towards the first electrode layer 201. Meanwhile, the sacrificial layer 202 under the first mask layer 203 can be removed by etching in a direction parallel to the top surface of the substrate 200. Thus, the cavity 209 can be formed between the first electrode layer 201 and the first mask layer 203.

In one embodiment, since the first mask layer 203 is made of a conductive material, the first mask layer 203 can be used as a second electrode layer of the pressure sensor after the formation of the cavity 209.

In one embodiment, the sacrificial layer 202 can be made of amorphous carbon. The sacrificial layer 202 can be etched by the isotropic etching process. The parameters of the isotropic etching process can be: etchant gases of $O_2$ and Ar; a power of less than 100 W; a voltage of less than 100 V; and a temperature of higher than 100 degree Celsius. In one embodiment, $O_2$ can react with the amorphous carbon and form CO and/or $CO_2$. The formed CO and/or $CO_2$ can thus be released.

During the etching of the sacrificial layer 202, the second mask layer 204 can protect the surface of the first mask layer 203 facing the first electrode layer 201 such that the surface of the first mask layer 203 is not etched.

Since an isotropic dry etch can be used to expose the first electrode layer 210 and form the through cavity between the first mask layer 203 and the first electrode layer 201, some of the sacrificial layer 202 surrounding the cavity 209 may not be etched. The un-etched portions of the sacrificial layer 202 can remain in the cavity 209 to provide support for the overhanging first mask layer 203 above the first electrode layer 201 as shown in FIG. 9.

In one embodiment, the first mask layer formed on the sacrificial layer can be made of a conductive material. The first mask layer can be used as the etch mask for the etching of the sacrificial layer. Since the etching of the conductive material does not produce hard-to-remove byproducts adhered to the etched surface, the sidewalls and bottoms of the openings can be easily cleaned by a cleaning process after the etching of the first mask layer. Thus, better electrical stability of the subsequently formed conductive plugs in the openings can be ensured. Further, since the first mask layer is made of a conductive material, the first mask can also be used as part of the semiconductor device. That is, the first mask layer is not removed after the formations of the openings and the conductive plugs. Specifically, the first mask layer can be used as the second electrode layer. After the removal of the sacrificial layer, the first mask layer can be overhung above the first electrode layer, and the pressure sensor can be formed accordingly. Therefore, fabrication process of the semiconductor device can be simplified, and damage to the electronic plugs can be reduced. Accordingly, the semiconductor fabricated by using the method disclosed can have better electrical stability.

Compared with a conventional pressure sensor, the present disclosure has the following advantages. For example, in the fabrication process of the present disclosure, the first mask layer formed on the surface of the sacrificial layer is a conductive material. The first mask layer is used as a mask to etch the sacrificial layer. Since the etching of the conductive material does not produce hard-to-remove byproducts (e.g., polymers), that are easily adhered to the etched surface, the inner sidewalls and the bottoms of the opening formed in the sacrificial layer can be cleaned easily by the cleaning process following the etching of the first mask layer. Better electrical stability of the subsequently formed conductive plugs can therefore be ensured. Further, since the material of the first mask layer is electrically conductive, the first mask layer can be part of the semiconductor device after the device fabrication. The first mask layer is not removed after the formations of the openings and the conductive plugs. Specifically, the first mask layer can be used as the second electrode layer. After the sacrificial layer is removed, the first mask layer can be overhung above the first electrode layer, forming a capacitive sensor. Therefore, fabrication process of the semiconductor device can be simplified. The damage to the conductive plugs by the fabrication process can also be reduced. Accordingly, the semiconductor devices formed by the fabrication method disclosed can have better electrical stability.

Further, the first mask layer can be made of Ti, TiN, TaN, and/or Al. Specifically, Ti has good conductivity and high mechanical strength. If the first mask layer is formed of Ti, even a thin Ti layer, the patterns of the first mask layer can stay stable during the etching of the sacrificial layer. Moreover, the first mask layer is used as the second electrode layer and has low electrical resistivity. Therefore, the operating current of the resultant semiconductor device can be increased, and energy consumption can be reduced accordingly.

Further, before formation of the first mask layer, the second mask layer can be formed on the sacrificial layer. The first mask layer can then be formed on the second mask layer. The second mask layer can be used to protect surface of the first mask layer facing the first electrode layer. Thus, when the first mask layer is used as the second electrode layer, the quality of the first mask layer can be ensured. In addition, since the second mask layer is covered by the first mask layer, and the first mask layer has high mechanical strength, the second mask layer can thus be thin. Therefore, the etch byproducts produced from the etching of the second mask layer are desirably less and can be easily removed. The performance of the semiconductor device formed by the fabrication disclosure can be ensured accordingly.

Furthermore, the cleaning process can include a dry cleaning process, followed by a wet cleaning process. Since there is only little etch byproducts adhered to the sidewalls and the bottoms of the openings and the byproducts can be easily removed, the sidewalls and the bottoms of the openings can be cleaned completely by using the dry cleaning process and the wet cleaning process. The conductive plugs formed in the openings can therefore have good shapes and surfaces, and better electrical stability.

Moreover, the disclosed semiconductor devices can include two exemplary sensors. For example, the first electrode layer and the isolation layer can form a humidity sensor. In addition, the first electrode layer, a subsequently formed second electrode layer (i.e., the first mask layer), and a cavity formed between the first electrode layer and the second electrode layer can form a pressure sensor. Thus, the semiconductor device can be an integrated device including a pressure sensor and a humidity sensor.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A semiconductor fabrication method, comprising:
providing a semiconductor substrate comprising a first electrode layer therein, wherein the first electrode layer has a top surface coplanar with a top surface of the semiconductor substrate;
forming a sacrificial layer on the semiconductor substrate and the first electrode layer;
forming a first mask layer on the sacrificial layer, wherein the first mask layer is made of a conductive material;
etching the first mask layer and the sacrificial layer, by a first etching process, using a patterned layer as an etch mask to etch the first mask layer until a surface of the sacrificial layer is exposed, and a second etching process following the first etching process, using the first mask layer as an etch mask to etch the sacrificial layer, until a surface of the first electrode layer is exposed to form openings through the first mask layer and the sacrificial layer;
performing a cleaning process to remove etch byproducts adhered to a surface of the first mask layer and adhered to sidewalls and bottom surfaces of the openings; and
forming conductive plugs in the openings after the cleaning process.

2. The method according to claim 1, wherein the first mask layer is made of Ti, TiN, TaN, Al, or a combination thereof.

3. The method according to claim 1, wherein the first mask layer has a thickness of about 200 Å to about 300 Å.

4. The method according to claim 1, wherein:
the openings formed in the first mask layer and in the sacrificial layer comprise at least two openings; and
the openings expose surfaces of at least two separate sub-electrodes of the first electrode layer.

5. The method according to claim 1, further including:
forming a second mask layer on the sacrificial layer before forming the first mask layer, wherein the first mask layer is formed on the second mask layer.

6. The method according to claim 5, wherein the second mask layer is made of $Si_3N_4$, with a thickness in a range of about 150 Å to about 250 Å.

7. The method according to claim 1, wherein the first etching process includes:
a pressure of about 5 mTorr to about 15 mTorr;
a power of about 400 W to about 600 W; and
etchant gases of $Cl_2$, $O_2$, and HBr,
wherein a flow rate of $Cl_2$ is about 100 sccm to about 150 sccm, a flow rate of $O_2$ is about 1 to about 5 sccm, and a flow rate of HBr is about 100 to about 150 sccm.

8. The method according to claim 1, wherein the second etching process includes:
a pressure of about 80 mTorr to about 120 mTorr;
a power of about 200 W to about 400 W; and
etchant gases of Ar and $O_2$, wherein a flow rate of Ar is about 30 sccm to about 80 sccm, and a flow rate of $O_2$ is about 200 sccm to about 300 sccm.

9. The method according to claim 1, wherein:
the conductive plugs are made of Cu, W, Al, or a combination thereof, the conductive plugs being formed by:
forming a conductive film on the surface of the first mask layer and the sidewalls and the bottom surfaces of the openings to fill up the openings; and
using a chemical mechanical polishing process to planarize the conductive film until the surface of the first mask layer is exposed to form the conductive plugs in the openings.

10. A semiconductor fabrication method, comprising:
providing a semiconductor substrate comprising a first electrode layer therein, wherein the first electrode layer has a top surface coplanar with a top surface of the semiconductor substrate;
forming a sacrificial layer on the semiconductor substrate and the first electrode layer;
forming a first mask layer on the sacrificial layer, wherein the first mask layer is made of a conductive material;
etching the first mask layer and the sacrificial layer until a surface of the first electrode layer is exposed to form openings through the first mask layer and the sacrificial layer;
performing a cleaning process to remove etch byproducts adhered to a surface of the first mask layer and adhered to sidewalls and bottom surfaces of the openings,
wherein the cleaning process includes:
a dry cleaning process on the surface of the first mask layer, and the sidewalls and the bottom surfaces of the openings, and
a wet cleaning process on the surface of the first mask layer, and the sidewalls and the bottom surfaces of the openings after the dry cleaning process, and
forming conductive plugs in the openings after the cleaning process.

11. The method according to claim 10, wherein the dry cleaning process includes:
a pressure of about 90 mTorr to about 100 mTorr;
a power of about 200 W to about 400 W; and
etchant gases of Ar and $O_2$,
wherein a flow rate of Ar is about 250 sccm to about 350 sccm, and a flow rate of $O_2$ is about 10 sccm to about 30 sccm.

12. The method according to claim 10, wherein the wet cleaning process includes:
a cleaning agent including diglycolamine and butyrolactone;
a cleaning temperature of about 50° C. to about 100° C.; and
a cleaning time of about 50 minutes to about 80 minutes.

13. The method according to claim 10, wherein the first mask layer is made of Ti, TiN, TaN, Al, or a combination thereof.

14. The method according to claim 10, wherein the first mask layer has a thickness of about 200 Å to about 300 Å.

15. The method according to claim 10, wherein:
the openings formed in the first mask layer and in the sacrificial layer comprise at least two openings; and
the openings expose surfaces of at least two separate sub-electrodes of the first electrode layer.

16. A semiconductor fabrication method, comprising:
providing a semiconductor substrate comprising a first electrode layer therein, wherein the first electrode layer has a top surface coplanar with a top surface of the semiconductor substrate;
forming a sacrificial layer on the semiconductor substrate and the first electrode layer;
forming a first mask layer on the sacrificial layer, wherein the first mask layer is made of a conductive material;
etching the first mask layer and the sacrificial layer until a surface of the first electrode layer is exposed to form openings through the first mask layer and the sacrificial layer;
performing a cleaning process to remove etch byproducts adhered to a surface of the first mask layer and adhered to sidewalls and bottom surfaces of the openings;
forming conductive plugs in the openings after the cleaning process;
forming through-holes in the first mask layer to expose a surface of the sacrificial layer; and
using an isotropic etching process through the through-holes in the first mask layer to remove a portion of the sacrificial layer between the first electrode layer and the first mask layer to form a cavity,
wherein the first mask layer is overhung above the first electrode layer, and the first mask layer is used as a second electrode layer of a pressure sensor.

17. The method according to claim 16, further including:
forming a second mask layer on the sacrificial layer before forming the first mask layer, wherein the first mask layer is formed on the second mask layer.

18. The method according to claim 17, wherein the second mask layer is made of $Si_3N_4$, with a thickness in a range of about 150 Å to about 250 Å.

19. The method according to claim 16, wherein:
the conductive plugs are made of Cu, W, Al, or a combination thereof, the conductive plugs being formed by:
forming a conductive film on the surface of the first mask layer and the sidewalls and the bottom surfaces of the openings to fill up the openings; and
using a chemical mechanical polishing process to planarize the conductive film until the surface of the first mask layer is exposed to form the conductive plugs in the openings.

20. The method according to claim 16, wherein:
the openings formed in the first mask layer and in the sacrificial layer comprise at least two openings; and
the openings expose surfaces of at least two separate sub-electrodes of the first electrode layer.

* * * * *